(12) United States Patent
Ryu et al.

(10) Patent No.: US 7,564,131 B2
(45) Date of Patent: Jul. 21, 2009

(54) SEMICONDUCTOR PACKAGE AND METHOD OF MAKING A SEMICONDUCTOR PACKAGE

(75) Inventors: Jin Hyung Ryu, Bucheon-si (KR); Sam Je Cho, Anyang-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/453,503

(22) Filed: Jun. 4, 2003

(65) Prior Publication Data

US 2003/0227083 A1 Dec. 11, 2003

(30) Foreign Application Priority Data

Jun. 7, 2002 (KR) .................... 10-2002-0031981

(51) Int. Cl.
| | |
|---|---|
| H01L 23/48 | (2006.01) |
| H01L 23/52 | (2006.01) |
| H01L 23/498 | (2006.01) |
| H01L 23/12 | (2006.01) |
| H01L 23/15 | (2006.01) |
| H05K 3/34 | (2006.01) |
| H05K 3/46 | (2006.01) |
| H05K 1/03 | (2006.01) |

(52) U.S. Cl. .............................. 257/738; 257/E23.009; 257/E23.067; 257/E23.069; 257/778; 257/737; 257/700; 257/701; 257/758

(58) Field of Classification Search ................. 257/738, 257/778, E23.009, E23.067, E23.069, 784, 257/737, 777, 686, 734, 700, 701, 758
See application file for complete search history.

(56) References Cited

U.S. PATENT DOCUMENTS

| | | | | |
|---|---|---|---|---|
| 4,346,516 A | * | 8/1982 | Yokouchi et al. | ............... 29/845 |
| 5,111,278 A | * | 5/1992 | Eichelberger | ............... 257/698 |
| 5,401,911 A | * | 3/1995 | Anderson et al. | ........... 174/262 |
| 5,636,104 A | | 6/1997 | Oh | |
| 5,637,832 A | * | 6/1997 | Danner | ....................... 174/260 |
| 5,763,059 A | | 6/1998 | Yamaguchi et al. | |
| 5,901,046 A | * | 5/1999 | Ohta et al. | ................... 361/760 |
| 6,121,688 A | * | 9/2000 | Akagawa | ..................... 257/778 |
| 6,132,543 A | * | 10/2000 | Mohri et al. | ............. 156/89.12 |
| 6,137,062 A | * | 10/2000 | Zimmerman | ................. 174/260 |
| 6,187,418 B1 | * | 2/2001 | Fasano et al. | ................ 428/210 |

(Continued)

FOREIGN PATENT DOCUMENTS

EP 0 786 808 A1 7/1997

(Continued)

*Primary Examiner*—Alexander O Williams
(74) *Attorney, Agent, or Firm*—Birch, Stewart, Kolasch & Birch, LLP

(57) ABSTRACT

Disclosed is a semiconductor package and method for package a semiconductor that has high reliability. A semiconductor package according to the present invention comprises a first substrate on which a circuit pattern and an electrode pad are formed; a second substrate which is adhered to the first substrate and on which a hole is formed; and a solder ball adhered to the electrode pad through the hole formed on the second substrate. Then, the second substrate is used as a solder resist. Accordingly, since the first substrate and the second substrate are formed of same material, the BGA package can be prevented from being cracked and being nonuniform when fired.

8 Claims, 9 Drawing Sheets

U.S. PATENT DOCUMENTS

| | | | |
|---|---|---|---|
| 6,362,637 B2 * | 3/2002 | Farnworth et al. | 324/755 |
| 6,408,511 B1 * | 6/2002 | Branchevsky | 29/843 |
| 6,459,039 B1 * | 10/2002 | Bezama et al. | 174/359 |
| 6,459,150 B1 * | 10/2002 | Wu et al. | 257/724 |
| 6,566,744 B2 * | 5/2003 | Gengel | 257/678 |
| 6,649,507 B1 * | 11/2003 | Chen et al. | 438/614 |
| 6,668,449 B2 * | 12/2003 | Rumsey et al. | 29/840 |
| 6,676,784 B2 * | 1/2004 | Setzer et al. | 156/89.12 |
| 6,683,384 B1 * | 1/2004 | Kossives et al. | 257/777 |
| 6,692,818 B2 * | 2/2004 | Hirano et al. | 428/209 |
| 6,762,503 B2 * | 7/2004 | Lee | 257/781 |
| 6,784,087 B2 * | 8/2004 | Lee et al. | 438/612 |
| 6,825,499 B2 * | 11/2004 | Nakajima et al. | 257/95 |
| 6,864,577 B2 * | 3/2005 | Clatanoff et al. | 257/737 |
| 6,876,216 B2 * | 4/2005 | Fu-Chin | 324/758 |
| 6,965,168 B2 * | 11/2005 | Langhorn | 257/778 |
| 6,982,380 B2 * | 1/2006 | Hoffmann et al. | 174/520 |
| 7,045,881 B2 * | 5/2006 | Hagen et al. | 257/659 |
| 7,122,907 B2 * | 10/2006 | Lee | 257/778 |
| 7,131,195 B2 * | 11/2006 | Akram | 29/843 |
| 7,161,237 B2 * | 1/2007 | Lee | 257/698 |
| 7,189,593 B2 * | 3/2007 | Lee | 438/107 |
| 2001/0008309 A1 * | 7/2001 | Iijima et al. | 257/737 |
| 2001/0042924 A1 * | 11/2001 | Hasegawa et al. | 257/780 |
| 2002/0014703 A1 * | 2/2002 | Capote et al. | 257/778 |
| 2002/0027282 A1 * | 3/2002 | Kawakami et al. | 257/700 |
| 2003/0164541 A1 * | 9/2003 | Lee | 257/686 |
| 2003/0227096 A1 * | 12/2003 | Takaike | 257/782 |
| 2003/0230813 A1 * | 12/2003 | Hirano et al. | 257/774 |
| 2004/0005771 A1 * | 1/2004 | Fan et al. | 438/613 |
| 2004/0058473 A1 * | 3/2004 | Feiertag et al. | 438/108 |
| 2004/0110366 A1 * | 6/2004 | MacKay et al. | 438/613 |
| 2004/0154166 A1 * | 8/2004 | Lee et al. | 29/852 |
| 2004/0168825 A1 * | 9/2004 | Sakamoto et al. | 174/260 |
| 2004/0197952 A1 * | 10/2004 | Lee | 438/107 |
| 2004/0197955 A1 * | 10/2004 | Lee | 438/108 |
| 2004/0231141 A1 * | 11/2004 | Nishinaka et al. | 29/609 |
| 2004/0244167 A1 * | 12/2004 | Kitagawa et al. | 29/25.35 |
| 2007/0258225 A1 * | 11/2007 | Inagaki et al. | 361/763 |

FOREIGN PATENT DOCUMENTS

| | | |
|---|---|---|
| EP | 0 814 643 A2 | 12/1997 |
| JP | 2-248066 * | 10/1990 |
| JP | 6-13755 * | 1/1994 |
| JP | 7-169873 * | 7/1995 |
| JP | 10-112514 A | 4/1998 |

* cited by examiner

SEMICONDUCTOR PACKAGE AND METHOD OF MAKING A SEMICONDUCTOR PACKAGE

BACKGROUND OF THE INVENTION

1. Field of the Invention

The present invention relates to a semiconductor package, and more particularly, to a semiconductor package with a high reliability and fabrication method thereof.

2. Description of the Related Art

Recently, as a variety of electronic devices are miniaturized, the circuits for driving these electronic devices are also highly integrated. In other words, circuits and electronic parts are integrated in a single semiconductor package and mounted on printed circuit board (PCB).

As an example of the semiconductor package, there is a ball grid array (hereafter, referred to as BGA) package in which a plurality of ceramic substrates each having a plurality of circuit patterns are stacked, the substrates are electrically connected to each other through via holes and solder balls are attached to electrode pads.

FIG. 1 illustrates a process of manufacturing a general ball grid array package. FIG. 2 is a flowchart illustrating a process of manufacturing the general ball grid array package shown in FIG. 1.

Referring to FIGS. 1 and 2, the fabrication of the BGA package starts with cutting a green tape wound on a roller 12 in a predetermined size (S21). Here, the green tape is formed as follows. Glass powder, bonding agent for maintaining viscosity of the glass powder, plasticizer for providing the bonding agent with flexibility so as to prevent the bonding agent from hardening, solvent for dissolving the bonding agent and the plasticizer, and small amounts of additional agents are mixed and dried to form slurry. The dried slurry is processed using a tape casting technique to be wound on the roller 12. Necessary substrates are provided by cutting the wound green tape in a predetermined size.

A plurality of via holes 16 are formed using a mechanical punching technique on four green tapes 13a-13d provided at the step S21 (S22).

Subsequently, a conductive paste 18 is filled in the via hole 16 and the filled conductive paste 18 is dried (S23). Here, the dried conductive paste serves as electrode pads.

The conductive paste 18 filled in the via hole 16 connects circuit patterns 20 formed on the green tapes 13a-13d with each other electrically during a post process.

After the conductive paste is filled in the via hole 16 at the step S23, the circuit patterns 20 are formed on the green tapes 13a-13d by using a screen printing technique (S24).

A solder resist is coated on the lowest green tape 13d on which the electrode pad 54 is formed among the green tapes 13a-3d on which the circuit patterns 20 are formed at the step S24 (S25). Here, the solder resist is coated on the entire surface of the lowest green tape 13d except the electrode pad 54.

The remaining green tapes 13a-13c are aligned on the lowest green tape 13d coated with a solder resist at the step S25 (S26).

If the four green tapes 13a-13d are aligned at the step S26, the four green tapes 13a-13d are stacked and adhered to each other at a laminating process (S27).

The green tapes 13a-13d adhered to each other at the step S27 are co-fired with a predetermined heat (S28). Each of the green tapes 13a-13d co-fired at the step S28 acts as a ceramic substrate and the ceramic substrates stacked at the step S28 becomes a circuit package 15 having a plurality of circuit layers.

Electronic components 2 including passive elements such as resisters R, inductors L, capacitors C and active elements such as transistors and integrated circuit chip (IC) are mounted on the package 15 provided at the step S28 (S29).

A material 5 functioning as a passivation layer is coated on the entire surface of the package 6 on which the electronic components are mounted (S30).

Lastly, each of solder balls 3 is adhered to each of the electrode pads positioned on the lower surface of the coated package 9 by using a solder ball reflow process (S31).

When the BGA packages 10 manufactured as described above are mounted on a printed circuit board (PCB) or another substrate, the solder ball of the BGA package is adhered to the electrode pad formed on the PCB or the electrode pad formed on the substrate.

Alternatively, if necessary, the BGA package 10 may be formed by adding a process of coating an electrode pad on the substrate after firing the stacked substrate.

Generally, the solder resist 1 formed on the BGA package 10 is formed using a screen printing technique on the area which the electrode pads do not exist.

However, in the laminating process in which a predetermined heat and pressure are used and in a firing process, nonuniform coating area and thickness of the solder resist cause the electrode pad to react with a firing substrate and thus damage the electrode. The solder ball 3 adhered to the electrode pad by a nonuniform solder resist is adhered in nonuniform shape, which deteriorates the reliability of the BGA package.

As shown in FIG. 3, since the solder resist 1 coated on the lowest green tape 13d slopes slightly, the shape of the solder ball 3 adhered to the edge of the solder resist 1 also slopes slightly.

The solder ball 3 is easily deformed by the external force 52, as the height of the solder ball 3 decreases. In other words, as the height of the solder ball 3 increases, the solder ball 3 is not easily deformed by the external force. This is because the cohesion of the solder ball 3 increases. The deformation of the solder ball deteriorates the reliability of the BGA package.

Furthermore, green tapes 13a-13g used as a substrate and the solder resist 1 coated on the green tape shrink physicochemically in a firing process. Then, if the shrinkage of the solder resist 1 is different from that of the green tapes 13a-13g, the BGA package in the firing process is cracked and deformed. To this end, it is necessary to develop a solder resist having the same shrinkage as that of the green tape.

Accordingly, in the conventional BGA package manufacturing method, the BGA package is cracked and deformed since the solder resist made of the material different from that of the substrate and the shrinkage of the substrate is different from that of the solder resist.

Additionally, in the conventional BGA package manufacturing method, the electrode pad. is reacted with a firing substrate and the electrode pad is injured due to nonuniform coating area and nonuniform coating thickness of the solder resist.

Furthermore, in the conventional BGA package manufacturing method, since cohesion of the solder ball adhered to the electrode pad is decreased due to the solder resist coated on the substrate, the shape of the solder ball is deformed and the solder ball is adhered nonuniformly to deteriorate the reliability of the BGA package.

SUMMARY OF THE INVENTION

Accordingly, the present invention is directed to a semiconductor package and method for packaging a semiconductor that substantially obviates one or more problems due to limitations and disadvantages of the related art.

It is an object of the present invention to provide a semiconductor package and method for package a semiconductor in which crack and distortion of the ball grid array package and damage of electrode pads are prevented to thereby enhance the reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor package comprises a first substrate on which a circuit pattern and an electrode pad are formed; a second substrate which is adhered to the first substrate and on which a hole is formed; and a solder ball adhered to the electrode pad through the hole formed on the second substrate.

The first substrate and the second substrate are formed of same material and the second substrate is thick 10-100 μm.

The second substrate can be used as a solder resist.

In another aspect of the present invention, a method for packaging a semiconductor package comprises the steps of: (a) forming a circuit pattern and an electrode pad on a first substrate; (b) forming a hole on a second substrate; (c) adhering the first substrate to the second substrate; and (d) adhering a solder ball to the electrode pad through the hole formed on the second substrate.

In another aspect of the present invention, a semiconductor package comprises a first substrate on which a circuit pattern and an electrode pad are formed; a second substrate which is adhered to the first substrate and on which a hole is formed, conductive material being coated on a inner wall of the hole; and a solder ball adhered to the electrode pad through the hole formed on the second substrate.

The solder ball can be contacted with the electrode pad and the conductive material.

In another aspect of the present invention, a method for packaging a semiconductor package comprising the steps of: (a) forming a circuit pattern and an electrode pad on a first substrate; (b) forming a hole on a second substrate; (c) coating conductive material on a inner wall of the hole; (d) adhering the first substrate to the second substrate; and (e) adhering a solder ball to the electrode pad through the hole formed on the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
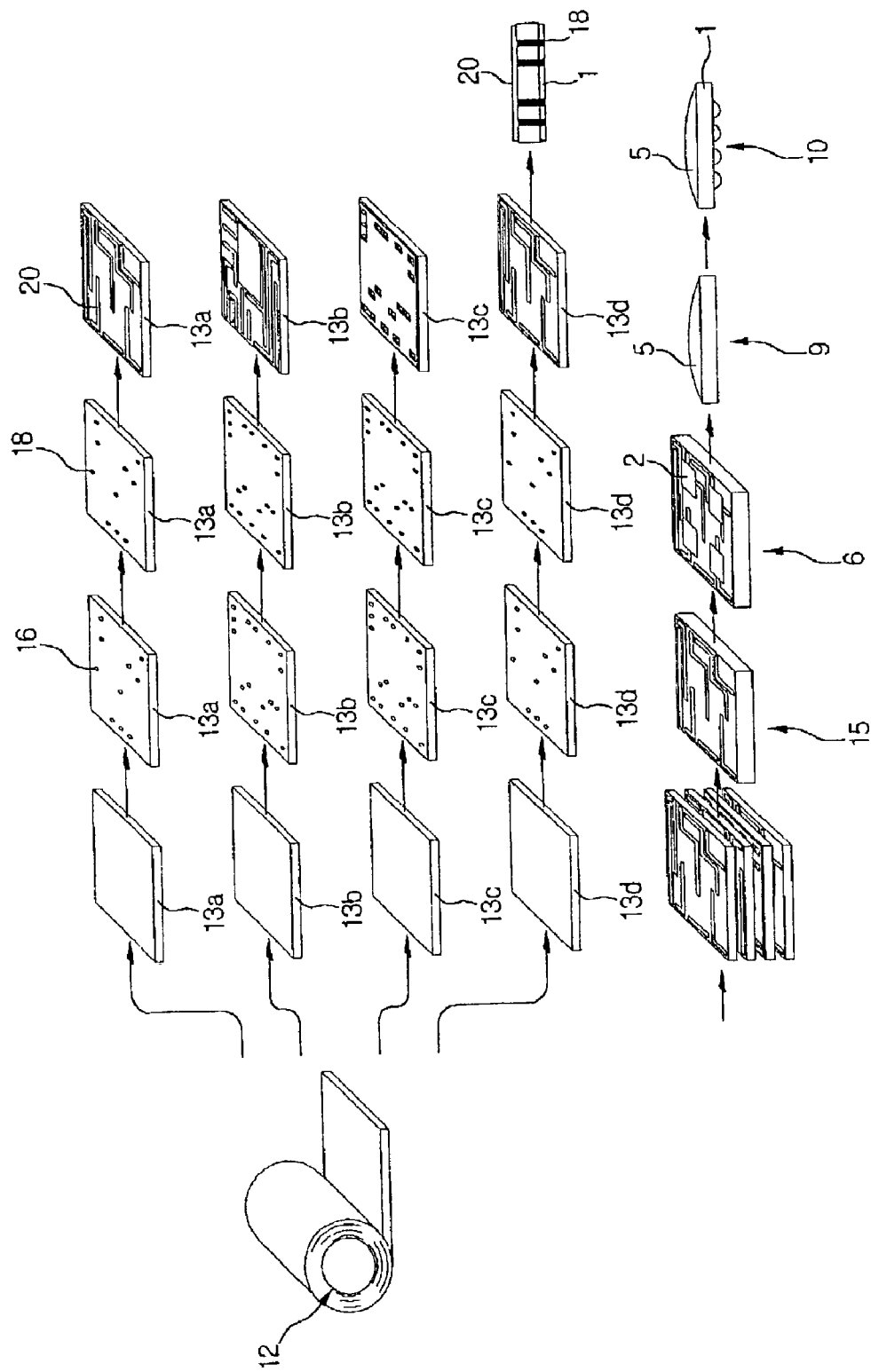
FIG. 1 illustrates a process of manufacturing a general ball grid array package.
Figure 2:
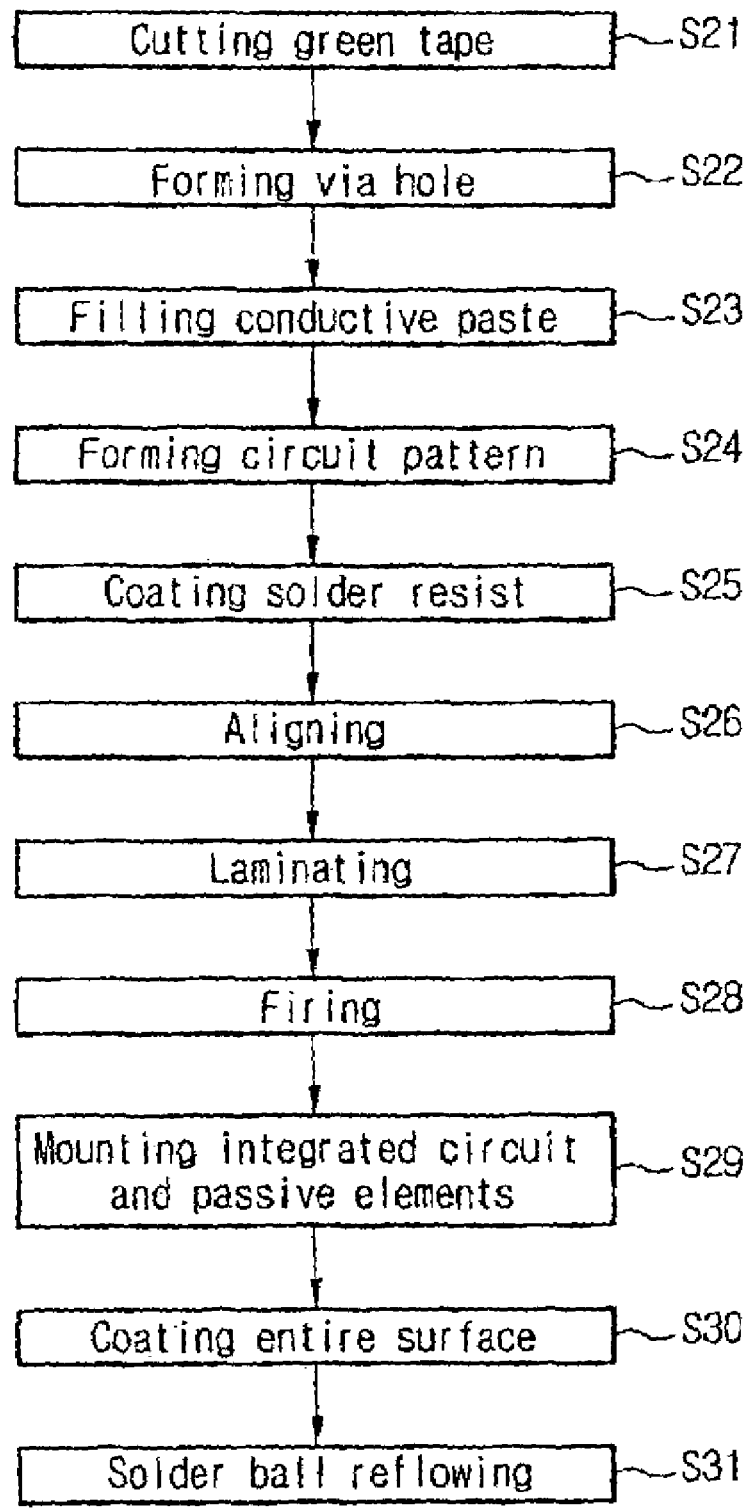
FIG. 2 is a flowchart illustrating a process of manufacturing the general ball grid array package shown in FIG. 1.
Figure 3:
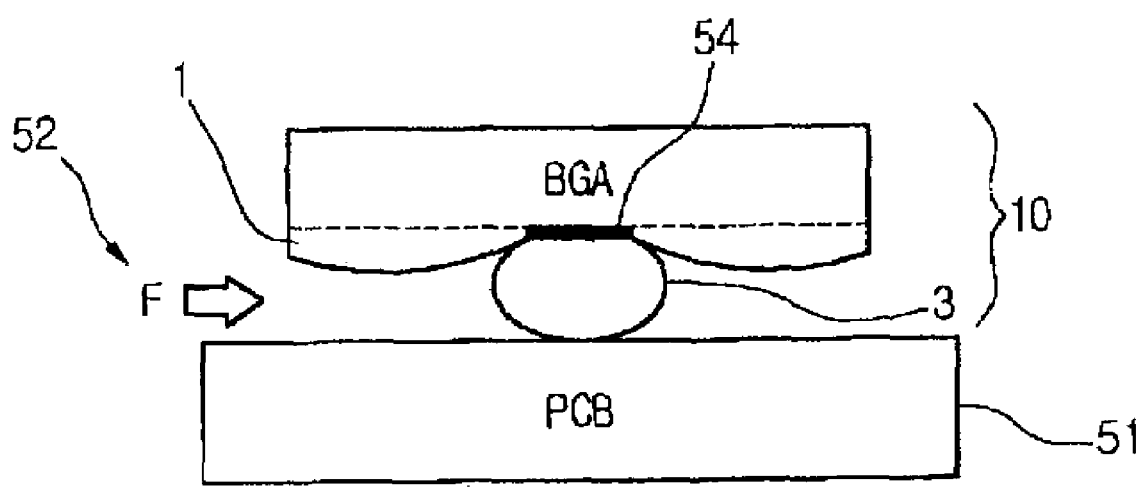
FIG. 3 is a cross-sectional view illustrating the ball grid array package shown in FIG. 1.
Figure 4:
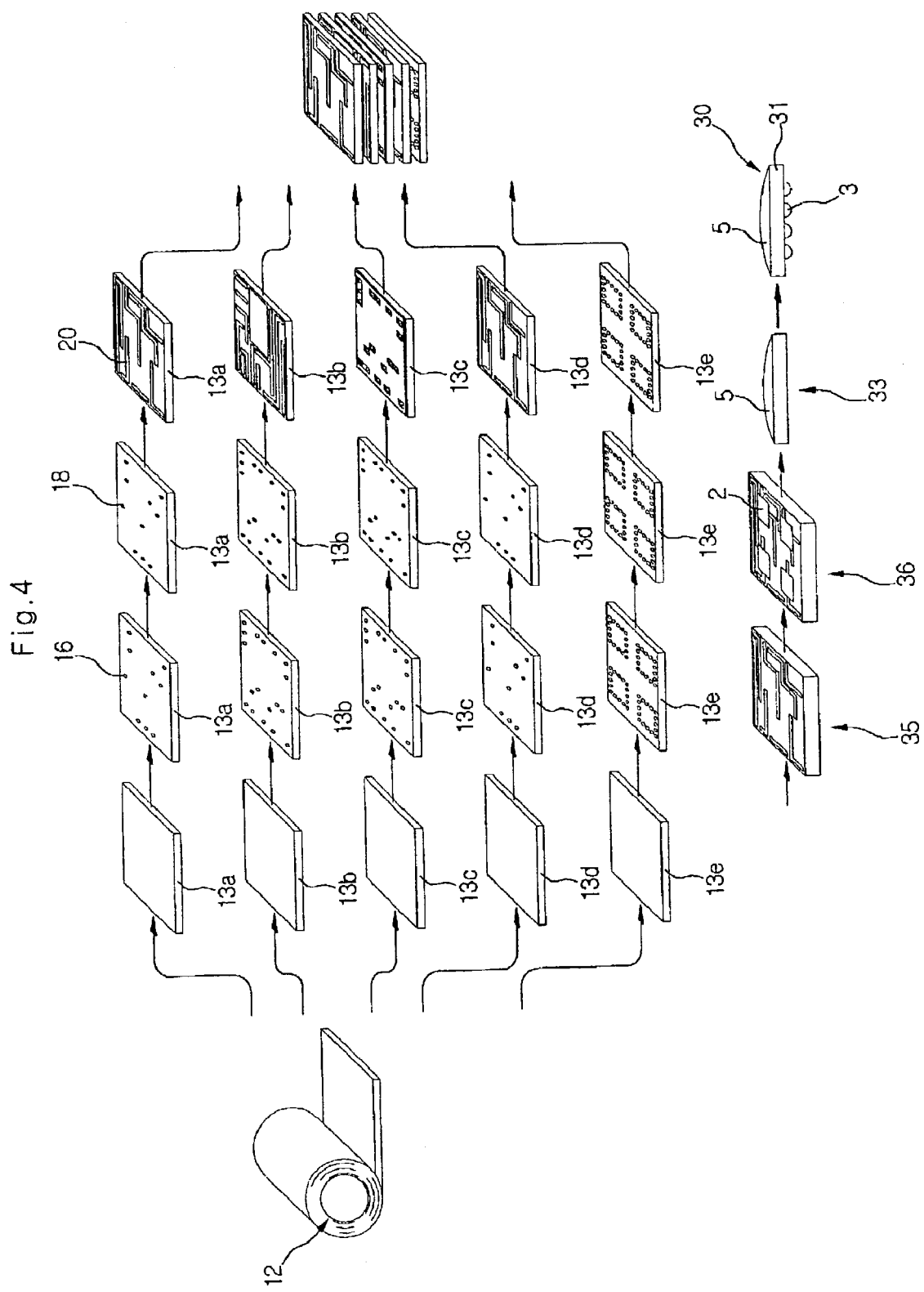
FIG. 4 illustrates a process of manufacturing a ball grid array package according to a first preferred embodiment.
Figure 5:
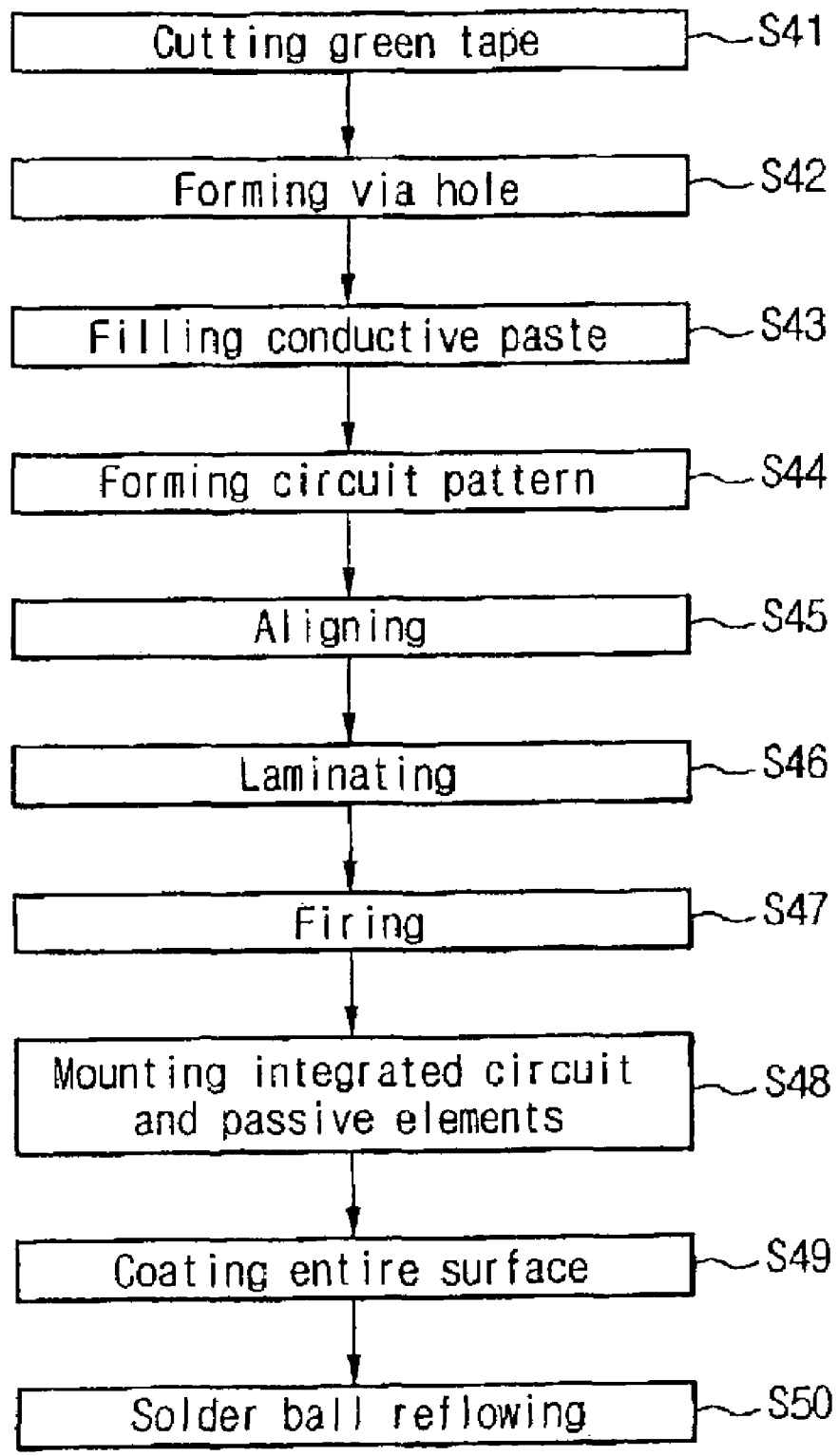
FIG. 5 is a flowchart illustrating a process of manufacturing the ball grid array package shown in FIG. 4.

FIGS. 4 and 5 illustrate a process of manufacturing a BGA package according to a first preferred embodiment.

Referring to FIGS. 4 and 5, the BGA package manufacturing process starts with cutting a green tape wound on a roller 12 in a predetermined size (S41). Then, the green tape 13e positioned at the lowest layer serves as a solder resist substrate and is formed at a thickness of 10-100 μm. The remaining green tapes 13a-13d except the solder resist substrate are processed and formed as the circuit pattern substrates. Since the circuit pattern substrates and the solder resist substrate are formed of the same material, the BGA package can be prevented from being cracked and being nonuniform when fired.

Here, the green tapes are formed as follows.

Glass powder, bonding agent for maintaining viscosity of the glass powder, plasticizer for providing the bonding agent with flexibility so as to prevent the bonding agent from hardening, solvent for dissolving the bonding agent and the plasticizer, and small amounts of additional agents are mixed and dried to form a slurry. After the slurry is dried, it is processed to have a predetermined thickness by using a doctor blade technique so that a green tape is formed. The manufactured green tape is wound on the roller 12.

A plurality of via holes 16 are formed in five green tapes 13a-13e provided at the step S41 by using the mechanical punching technique (S42). Then, the via hole 16 formed in the green tape 13e acts as a guide for exposing the electrode pad formed on any one of the remaining green tapes 13a-13d to exterior.

Subsequently, a conductive paste 18 is filled in the via hole 16 of the green tapes 13a-13d for the substrate and the filled conductive paste 18 is dried (S43). Here, the dried conductive paste 18 serves as electrode pads.

At this time, the conductive paste 18 filled in the via hole 16 functions to electrically connect circuit patterns 20 formed on the green tapes 13a-13d with each other at a post process.

The conductive paste 18 is filled in the via hole 16 at the step S43 and each of the circuit patterns 20 is formed on each of the green tapes 13a-13d for the substrate by using a screen printing technique (S44).

The green tapes 13a-13e are sequentially aligned such that the green tape 13e for the solder resist is positioned below the green tape 13d for the substrate positioned at the lowest layer among the green tapes 13a-13d on which the circuit patterns 20 are formed at the step S44 (S45).

If the four green tapes 13a-13d for the substrate and the green tape 13e for the solder resist are aligned in a stack structure at the step S45, the five green tapes 13a-13e are laminated and adhered to each other at a laminating process (S46).

The green tapes 13a-13e adhered to each other at the step S46 are co-fired with a predetermined heat (S47).

Each of the green tapes 13a-13d for the substrate co-fired at the step S47 acts as a ceramic substrate and the ceramic substrates laminated at the step S47 become a circuit package 35 having a plurality of circuit layers.

Electronic components 2 including passive elements such as resisters R, inductors L, capacitors C and active elements such as transistors and integrated circuit chip (IC) are mounted on the package 35 provided at the step S47 (S48).

The material 5 acting as a passivation layer is coated on the entire surface of the package 36 formed at the step S48 (S49).

Finally, each of the solder balls 3 is bonded to each of the electrode pads 18 formed on the substrates for the circuit pattern through the via hole formed in the substrate 31 for the solder resist positioned on the lower surface of the package 33 by using a solder ball reflow process (S50).

When the BGA packages 30 manufactured as described above are mounted on a printed circuit board (PCB) or another substrate, the solder balls of the BGA package are bonded to the electrode pad formed on the PCB or the electrode pad formed on the substrate.

At this time, if necessary, the BGA package 30 may be formed by adding a process of coating an electrode pad on the substrate after firing the laminated substrate. In addition, the BGA package 30 according to the first embodiment of the present invention includes four green tapes for the substrate but the BGA package is formed by laminating a plurality of green tapes for substrate depending on circuit configuration to be manufactured.

Figure 6:
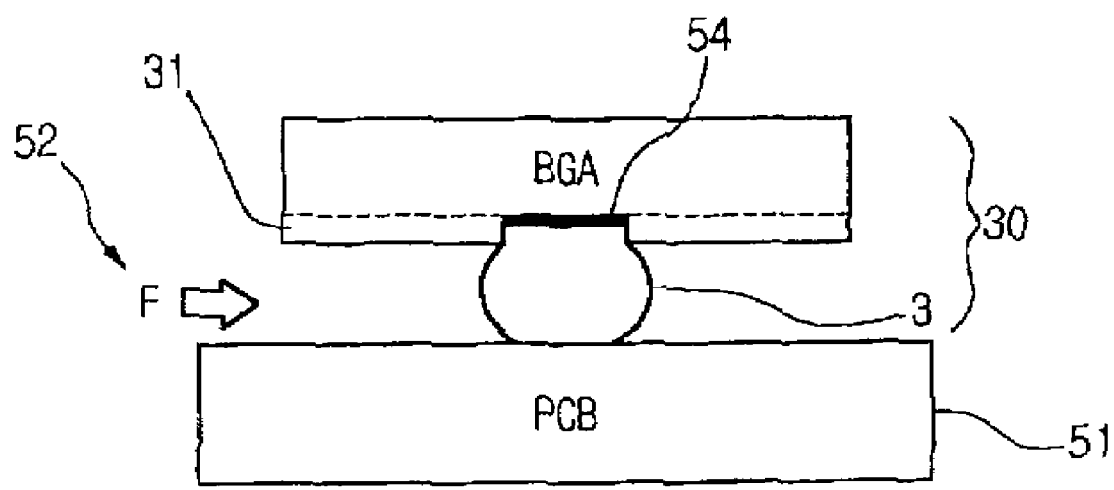
FIG. 6 is a cross-sectional view illustrating the ball grid array package shown in FIG. 4.

FIG. 6 is a cross-sectional view illustrating that the ball grid array package 30 according to the first embodiment of the present invention is mounted on the PCB.

Referring to FIG. 6, in the ball grid array package 30 according to the first embodiment of the present invention, the thickness of the solder resist substrate 31 can be increased by increasing the thickness of the green tape 13e. If the thickness of the solder resist substrate 31 is increased, the height of the solder ball 3 formed on the via hole of the solder resist substrate 31 increases. As a result, resistance force of the solder ball 3 of the BGA package 30 mounted on the PCB 51 against shear stress (F) 52 exerted by temperature variation is increased to enhance adhesion with the electrode pad 54. The adhesion enhancement of the solder ball 3 and the electrode pad 54 improves the reliability of the BGA package 30.

In addition, since the circuit pattern substrate and the solder resist substrate are formed of the same material, the BGA package can be prevented from being cracked and distorted.

Figure 7:
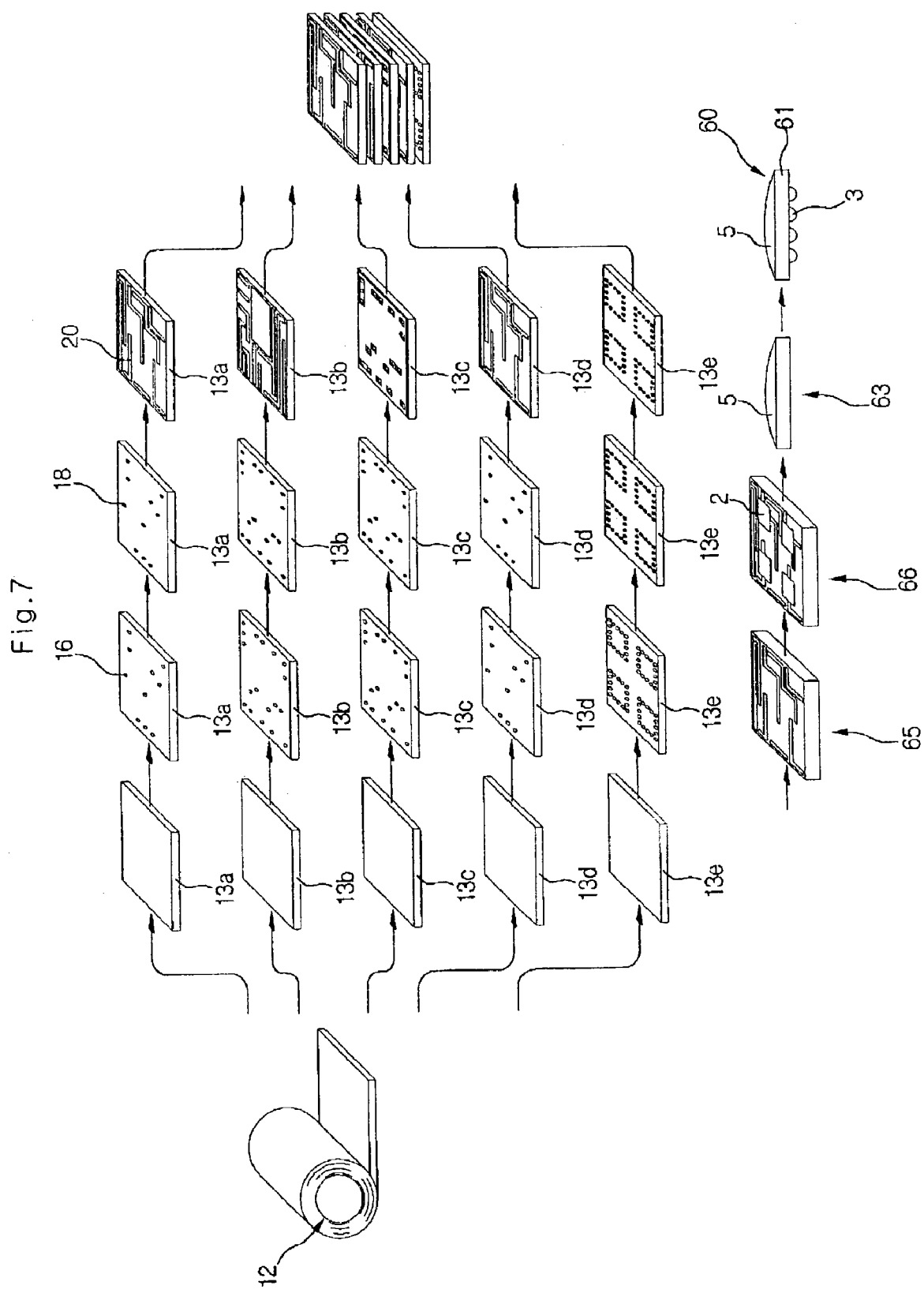
FIG. 7 illustrates a process of manufacturing a ball grid array package according to a second preferred embodiment.
Figure 8:
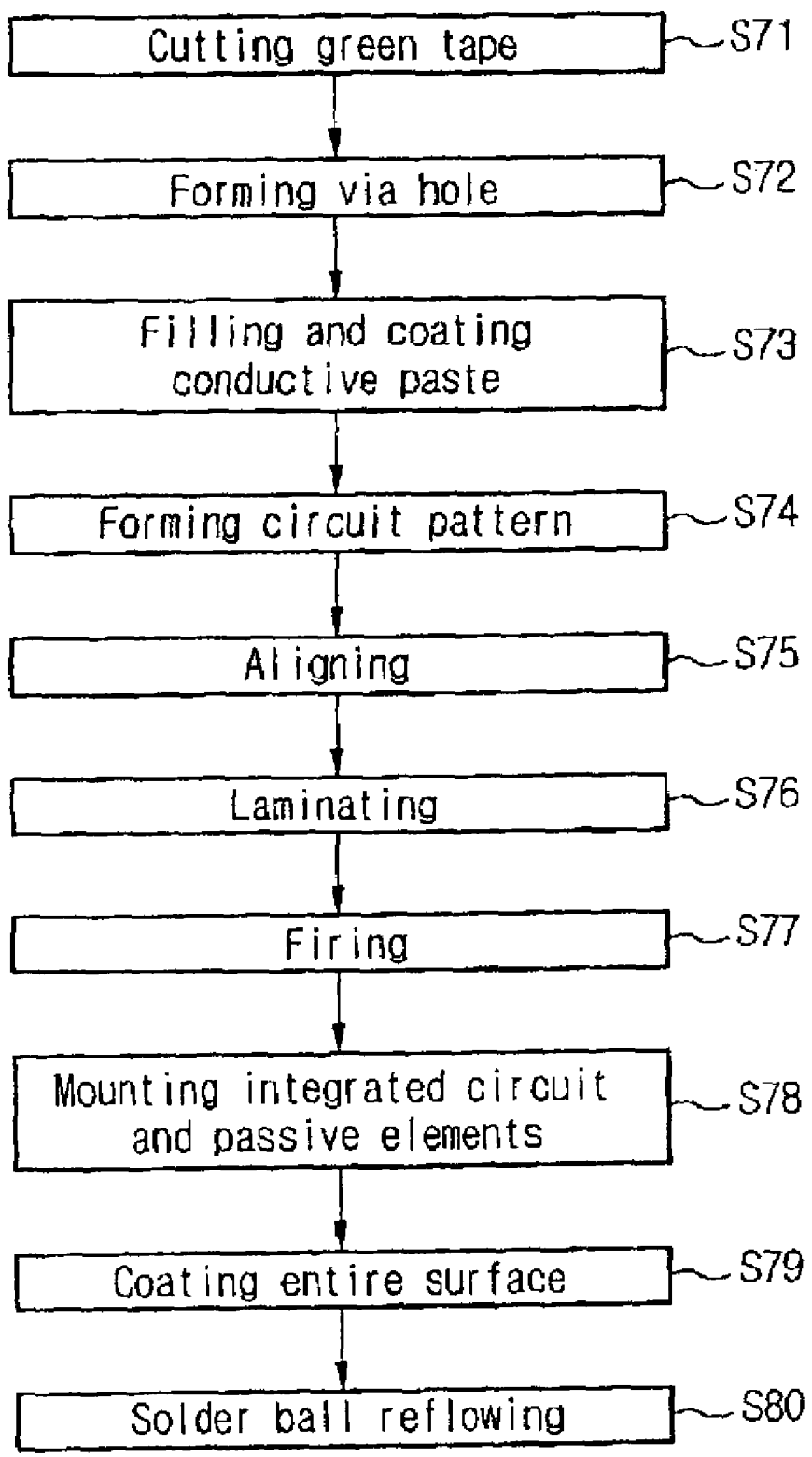
FIG. 8 is a flowchart illustrating a process of manufacturing the ball grid array package shown in FIG. 7.

FIGS. 7 and 8 illustrate a process of manufacturing a BGA package according to a second preferred embodiment.

Referring to FIGS. 7 and 8, the BGA package manufacturing process starts with cutting a green tape wound on a roller 12 in a predetermined size (S71). Then, a green tape 13e positioned at the lowest layer serves as a solder resist substrate and is formed at a thickness of 10-100 μm. The remaining green tapes 13a-13d except the solder resist substrate are processed and formed as the circuit pattern substrate.

Here, the green tapes are formed as follows. Glass powder, bonding agent for maintaining viscosity of the glass powder, plasticizer for providing the bonding agent with flexibility so as to prevent the bonding agent from hardening, solvent for dissolving the bonding agent and the plasticizer, and small amounts of additional agents are mixed and dried to form a slurry. After the slurry is dried, it is processed so as to have a predetermined thickness by using a doctor blade technique, so that a green tape is formed. The formed green tape is wound on the roller 12.

A plurality of via holes 16 are formed in five green tapes 13a-13e provided at the step S71 by using a mechanical punching technique (S72). Then, the via hole formed in the green tape 13e acts as a guide for exposing the electrode pad formed on any one of the remaining green tapes 13a-13d to exterior.

Subsequently, a conductive paste 18 is filled in a via hole 16 of the green tapes 13a-13d for the substrate and a conductive material 18 is coated in the via hole 16 of the green tape 13e for the solder resist. The filled and coated conductive paste 18 is dried (S73). Here, the dried conductive paste serves as electrode pads.

While the via hole of the green tapes 13a-13d for the circuit pattern is completely filled with the conductive paste, the via hole of the green tape 13e for the solder resist is coated with the conductive paste by a predetermined thickness on its inner wall. Accordingly, the via hole of the green tape 13e still has a predetermined size of hole.

Thus, by coating conductive paste along the inner wall of the via hole for the solder resist 13e, when it is intended to bond solder balls to electrode pads formed on any one of the green tapes 13a-13d for the circuit pattern, the solder balls are bonded to the electrode pads or the conductive paste throughout a wider area.

Meanwhile, the conductive paste 18 filled in the via hole 16 electrically connects circuit patterns 20 formed on the green tapes 13a-13d with each other electrically at a post process. The conductive paste 18 coated in the via hole of the green tape 13e is connected to an electrode pad that is an input/output pad formed on the green tape 13d for the lowest substrate electrically at a post process.

On the green tapes 13a-13d in which the conductive paste is filled in the via hole 16 at the step S73, the circuit patterns 20 are formed by using a screen printing technique (S74).

The green tapes 13a-13e are sequentially aligned so that the green tape 13e for the solder resist is positioned on the lower portion of the green tape 13d for the substrate positioned at the lowest green tape of the green tapes 13a-3d on which the circuit patterns 20 are formed at the step S74 (S75).

If the four green tapes 13a-13d for the substrate and the green tape 13e for the solder resist are aligned in a stack structure at the step S75, the five green tapes 13a-13e are adhered in a stack structure to each other at a laminating process (S76).

The green tapes 13a 13e adhered to each other at the step S76 are co-fired with a predetermined heat (S77). Each of the green tapes 13a-13d for the substrate co-fired at the step S77 acts as a ceramic substrate, and the ceramic substrates laminated at the step S47 become a circuit package 65 having a plurality of circuit layers.

Electronic components 2 including passive elements such as resisters R, inductors L, capacitors C and active elements such as transistors and integrated circuit chip (IC) are mounted on the package 65 provided at the step S77 (S78).

Material 5 acting as a passivation layer is coated on the entire surface of the package 66 formed at the step S78 (S79).

Lastly, each of solder balls 3 is bonded to each of the electrode pads 54 formed on the substrates for the circuit pattern through the via hole 16 formed in the substrate 61 for the solder resist positioned on the lower surface of the package 63 by using a solder ball reflow process (S80).

When the BGA packages 60 manufactured as described above is mounted on a printed circuit board (PCB) or another substrate, the solder balls of the BGA package are bonded to the electrode pad formed on the PCB or the electrode pad formed on the substrate.

Then, if necessary, the BGA package 60 may be formed by adding a process of coating an electrode pad on the substrate after plasticizing the laminated substrate. In addition, the BGA package 60 according to the second embodiment of the present invention includes four green tapes for the substrate but the BGA package is formed by laminating a plurality of green tapes for the substrate depending on circuit configuration to be manufactured.

Figure 9:
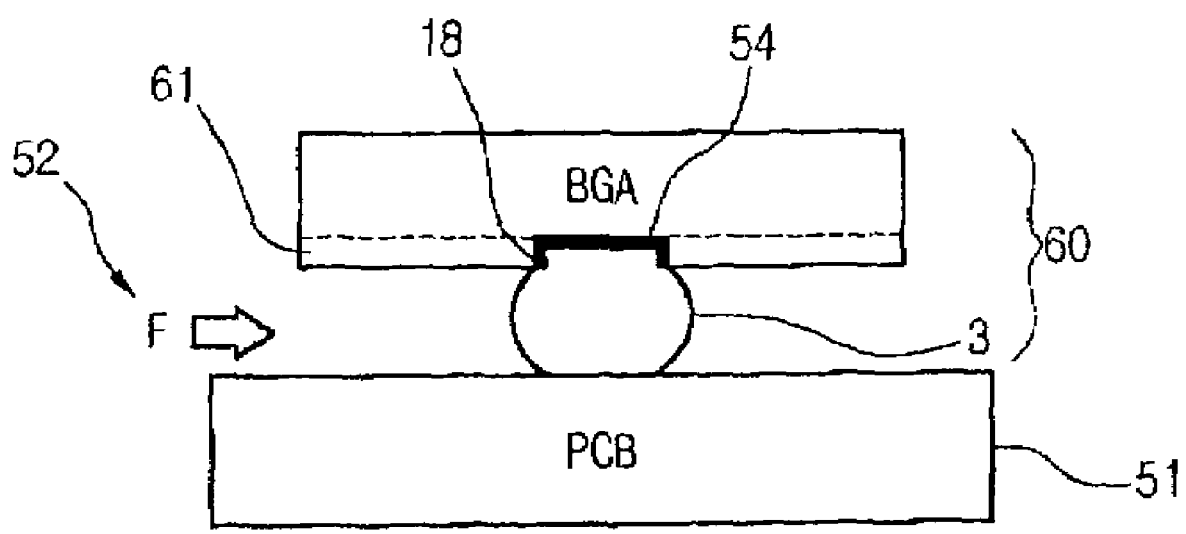
FIG. 9 is a cross-sectional view illustrating the ball grid array package shown in FIG. 7.

FIG. 9 is a cross-sectional view illustrating that the ball grid array package 60 according to the first embodiment of the present invention is mounted on the PCB 51.

Referring to FIG. 9, in the ball grid array package 60 according to the second embodiment of the present invention, the thickness of the solder resist substrate 61 can be increased by increasing the thickness of the green tape 13e. If the thickness of the substrate 61 of the solder resist is increased, the height of the solder ball 3 formed on the via hole of the substrate 61 for the solder resist increases. As a result, resistance force of the solder ball 3 of the BGA package 60 mounted on the PCB 51 against a shear deformation force (F) 52 exerted by the temperature variation is increased to enhance adhesion with the electrode pad 54. In addition, the conductive paste 18 coated on the via hole 16 of the solder resist 61 in contact with the solder ball 3 is electrically connected to the electrode pad 54 formed on the substrate so that the electrical adhesion area of the solder ball 3 and the electrode pad 54 is increased.

The adhesion and adhesion area enhancement between the solder ball 3 and the electrode pad 54 improve the reliability of the BGA package 30.

As a result, since the solder resists 31 and 61 of the BGA package 30 and 60 according to the embodiments of the present invention are formed of the green tape 12 that is the same material as that used for the substrate, the shrinkages of the substrate and the solder resist are the same, so that crack and distortion of the BGA package that may be caused by the firing process are prevented.

In addition, since the green tape 12 is formed with a predetermined thickness by using the above-mentioned doctor blade technique and the via hole of the green tape is formed using the mechanical punching technique, the solder resist is uniform in its thickness and has a uniform area of via hole. Accordingly, the reaction between the BGA package electrode pattern and the firing substrate which was generated during the conventional firing process is prevented.

Also, since the thickness of the solder resist can be freely controlled, the height of the solder ball can be increased. Accordingly, the resistance force against the external shear stress increases.

The conductive paste coated on the via hole of the solder resist increases the electric adhesion area between the solder ball and the electrode pad. Accordingly, the BGA package according to the embodiments of the present invention has high reliability.

As described above, the solder resist of the BGA package according to the present invention is formed of the green tape whose material is the same as that of the substrate, the BGA package is prevented from being cracked and distorted when being fired.

Additionally, since the green tape is formed with a predetermined thickness by using the doctor blade technique and the via hole of the green tape is formed using a mechanical punching technique, the solder resist is uniform in its thickness and has a uniform area of via hole. Accordingly, the reaction between the BGA package electrode pattern and the firing substrate which was generated during the conventional firing process is prevented.

Also, since the thickness of the solder resist can be freely controlled, the height of the solder ball can be increased. Accordingly, the resistance force against the external shear stress increases. Since increase in the height of the solder ball increases the cohesion of the solder ball, the resistance force against the external shear deformation force increases. In other words, the deformation of the solder ball is reduced. It enhances the reliability of the BGA package. The conductive material coated on the via hole of the solder resist increases the electric adhesion area between solder the ball and the electrode pad. Accordingly, the BGA package has high reliability.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor package comprising:
   a first ceramic tape substrate on which a circuit pattern and an electrode pad are formed;
   a second ceramic tape substrate which is made of the same material as the first substrate and is adhered to the first substrate without an intervening adhesive medium and in which a hole having an inner wall coated with conductive material is formed; and
   a solder ball adhered to the electrode pad through the hole formed on the second substrate,
   wherein the solder ball is in direct physical contact with the electrode pad and the conductive material.

2. The semiconductor package of claim 1, wherein when the first substrate and the second substrate are adhered to each other, the conductive material is connected with the electrode pad electrically.

3. The semiconductor package of claim 1, wherein the first substrate comprises a plurality of laminated substrates.

4. The semiconductor package of claim 1, wherein the second substrate is 10-100 μm thick.

5. The semiconductor packages of claim 1, wherein a portion of the solder ball fills the inner volume of the hole.

6. A semiconductor package comprising:
   a first substrate on which a circuit pattern and an electrode pad are formed;
   a second substrate which is made of the same material as the first substrate and is adhered to the first substrate and in which a hole is formed; and
   a solder ball adhered in direct physical contact with the electrode pad through the hole formed on the second substrate,
   wherein the first substrate and the second substrate are green tapes having flexibility.

7. The semiconductor package of claim 1, wherein the first ceramic substrate has a distinct thickness and the second ceramic substrate has a distinct thickness and the hole thickness is the thickness of the second ceramic substrate.

8. The semiconductor package of claim 6, wherein the first substrate has a distinct thickness and the second substrate has a distinct thickness and the hole depth is the thickness of the second substrate.

* * * * *